(12) United States Patent
Moore

(10) Patent No.: US 6,515,350 B1
(45) Date of Patent: Feb. 4, 2003

(54) PROTECTIVE CONFORMAL SILICON NITRIDE FILMS AND SPACERS

(75) Inventor: John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/507,464

(22) Filed: Feb. 22, 2000

(51) Int. Cl.$^7$ ................................................ H01L 23/58
(52) U.S. Cl. ...................... 257/640; 257/649; 257/760; 257/900
(58) Field of Search ................................. 257/760, 900, 257/640, 649; 438/595, 790, 791

(56) References Cited

U.S. PATENT DOCUMENTS

| | | | | |
|---|---|---|---|---|
| 4,636,822 A | * | 1/1987 | Codella et al. ............. | 257/282 |
| 5,168,072 A | * | 12/1992 | Moslehi ...................... | 257/327 |
| 5,719,425 A | * | 2/1998 | Akram et al. ................ | 257/344 |
| 6,091,121 A | * | 7/2000 | Oda ............................. | 257/408 |
| 6,130,102 A | * | 10/2000 | White, Jr. et al. ............... | 438/3 |
| 6,144,071 A | * | 11/2000 | Gardner et al. .............. | 257/344 |
| 6,162,737 A | * | 12/2000 | Weimer et al. ............. | 438/738 |
| 6,261,891 B1 | * | 7/2001 | Cheng et al. ............... | 438/238 |

* cited by examiner

*Primary Examiner*—Tom Thomas
*Assistant Examiner*—Thien F. Tran
(74) *Attorney, Agent, or Firm*—Dickstein Shapiro Morin & Oshinsky LLP

(57) ABSTRACT

A spacer film capable of protecting a gate stack in an integrated circuit wafer having a thin nucleation or seed layer of silicon nitride on the gate stack and a second, primary layer of silicon nitride on the nucleation layer. The spacer is formed using a BTBAS precursor and the primary layer may have carbon incorporated therein. The spacer film is able to protect a gate stack or other semiconductor device from corrosion by chemicals used in certain etching techniques. The invention further includes various semiconductor devices utilizing the new spacer film.

35 Claims, 5 Drawing Sheets

PROTECTIVE CONFORMAL SILICON NITRIDE FILMS AND SPACERS

FIELD OF THE INVENTION

The invention relates to a method for depositing protective spacer layers on stacked arrays, e.g. gate stacks, in a semiconductor device, and more specifically, to a method of deposition of spacer layers which results in enhanced resistance to contact erosion, improved conformality and cross wafer uniformity, and better chemical utilization. The invention also relates to the stacked arrays having the improved protective spacer layers deposited thereon.

BACKGROUND OF THE INVENTION

Silicon nitride ($Si_3N_4$) protective layers are commonly used as spacer material in semiconductor wafer fabrication. These spacer layers protect the stacked structures, e.g. "gate stacks", located on the wafers during a self-aligned contact etching (SAC) process. Shown in FIG. 1A is a portion of a semiconductor wafer 10 including substrate 12 formed of a semiconductor material such as silicon having field oxide regions 17 and doped regions 19. Gate stacks 14, formed of at least an oxide layer 21 and an overlying conductive layer 23, e.g. doped polysilicon, are fabricated on substrate 12 and are spaced apart from one another. Overlying the gate stacks is a protective silicon nitride layer 16. An insulative layer 18, in turn, overlays the array of gate stacks 14 and the silicon nitride layer 16. The insulative layer 18 may be formed of a material such as Boro-Phospho-Silicate Glass (BPSG). The illustrated structure may be used, for example, as an intermediate structure in DRAM memory cell fabrication.

Unfortunately, silicon nitride is not an ideal spacer film material. As shown in FIGS. 1B and 1C, often times contact erosion occurs at the side interface of the protective silicon nitride layer 16 and the gate stack(s) 14 during a self-aligned contact (SAC) etching process 20. As shown in FIG. 1C, the etching chemistry/conditions utilized in the SAC process may erode the silicon nitride layer 16 leaving crevices or cracks 22 at this interface which exposes the sides of the gate stacks 14. As shown in FIG. 1D, the seepage residue and deterioration of the silicon nitride layer 16 interferes with the performance of a fabricated conductive plug 24, e.g. a polysilicon plug, which needs to be isolated from the gate conductive layer 23.

Erosion of the silicon nitride layer during SAC etching can be considerably mitigated by utilizing bistertbutylaminosilane (BTBAS) as a precursor material. The BTBAS reacts with ammonia ($NH_3$) to form the silicon nitride layer 16. However, this BTBAS-derived silicon nitride layer in practice is difficult to form uniformly across a wafer as a result of gas transport effects when the layer is formed in a batch furnace. This problem of nonuniform deposition of the silicon nitride layer across the gate stack array areas and extending to the open areas of the wafer has meant that the sides of the gate stacks often receive only about 70% of the total material which is received in the open areas. In addition, while the BTBAS deposited silicon nitride layer exhibits profile conformality up to 85% (from the open areas to the sides of the gate stack arrays), higher conformality (approaching 100%) is often desired in some applications. Further, the cost associated with using precursors such as BTBAS requires that chemical utilization of the compound (s) involved in forming the spacer film layers be increased to provide lower cost processing.

What is therefore needed in the art is an improved method of spacer film layer deposition which results in improved conformality and uniformity, as well as better chemical utilization of all compounds involved in the deposition process across all segments of the semiconductor wafer. Also needed are gate stacks with improved contact erosion resistivity.

SUMMARY OF THE INVENTION

The invention provides a method for protecting a gate stack in an integrated circuit wafer which comprises depositing a thin seed or nucleation layer of silicon nitride on the gate stack, and thereafter depositing a primary layer of silicon nitride using bistertbutylaminosilane (BTBAS) as a precursor, either alone or combination with other materials. The nucleation and primary layers form a spacer film having improved uniformity and conformality, and obtain a better chemical utilization of the BTBAS.

The invention further provides a semiconductor device containing a gate stack that has a nucleation layer of silicon nitride formed on the sides and top thereof, and over the nucleation layer, a primary layer containing more silicon nitride, alone or in combination with other materials, which is deposited using BTBAS as a precursor. Together the nucleation and primary layers form a spacer film which will protect a gate stack array of a semiconductor device from the corrosive effects of the chemicals, e.g. freon-containing compounds, used in dry contact opening SAC etching. The spacer film herein provided will also exhibit a reduced etchant rate in many types of fluorine-based, wet etchant chemicals, such as hydrofluoric acid (HF) and HF/TMAH.

In addition, the invention provides an integrated circuit having a substrate with at least one gate stack thereon. A spacer film is formed over the gate stack and contains a nucleation layer, and over the nucleation layer, a primary layer of silicon nitride. A conductive plug is provided in an insulation layer in the circuit, and is in contact with the substrate. The conductive plug is separated from the gate stack by the spacer film.

Additional advantages and features of the present invention will become more readily apparent from the following detailed description and drawings which illustrate various embodiments of the invention.

DETAILED DESCRIPTION OF THE PREFERRED EMBODIMENTS

The invention relies on the discovery that the deposition of a very thin silicon nitride nucleation layer and a primary layer atop the nucleation layer improves uniformity and conformality of spacer films on gate stacks in semiconductor wafers, while at the same time enhancing resistivity of the gate stack to corrosion, and obtaining a better utilization of the deposition chemistry.

Reference herein shall be made to the terms "wafer" and "substrate", which are to be understood as including a silicon base, silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "wafer" or "substrate" in the following description, previous process steps may have been utilized to form arrays, regions or junctions in or on the base semiconductor structure or foundation. In addition, the semiconductor need not be silicon-based, but could be based on silicon-germanium germanium or gallium arsenide.

Figure 1A:
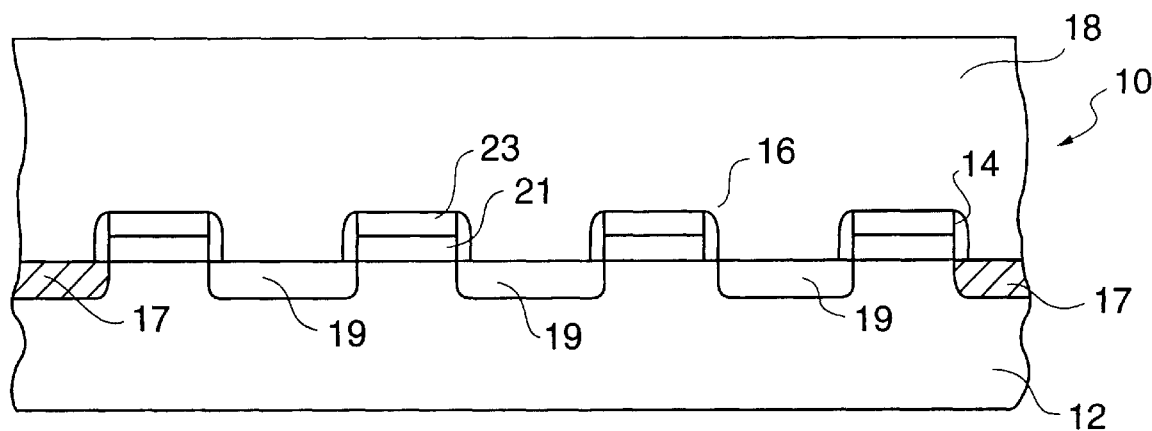
FIGS. 1A through 1D are side views of a semiconductor device in an immediate stage of fabrication.
Figure 1B:
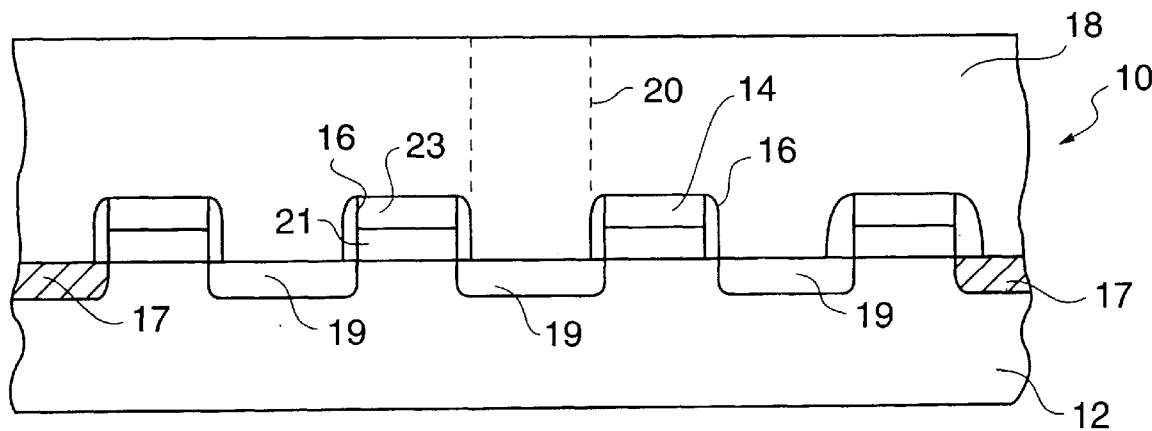
Figure 1C:
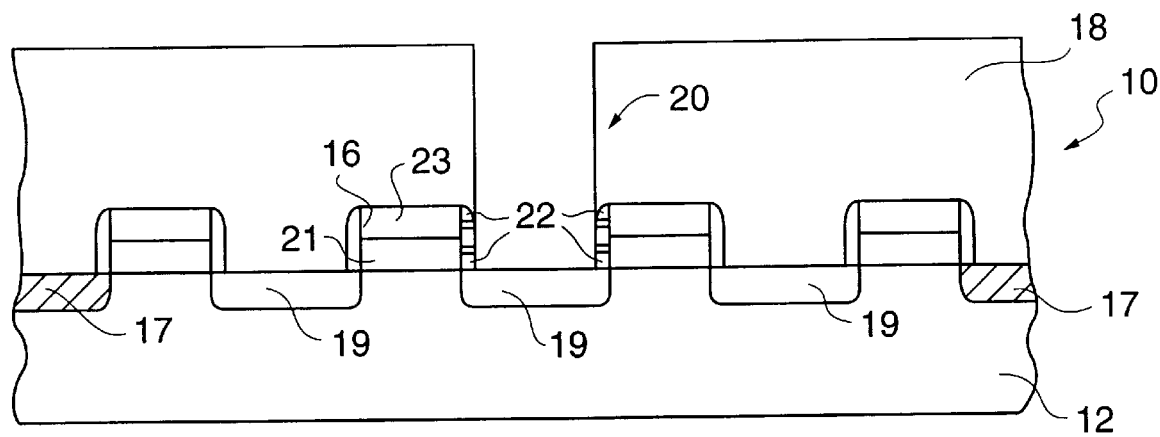
Figure 1D:
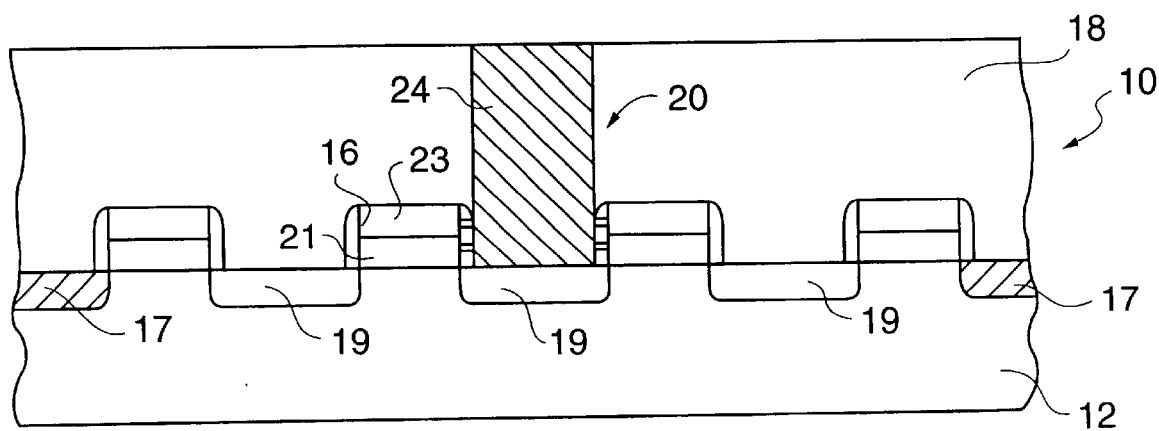
Figure 2:
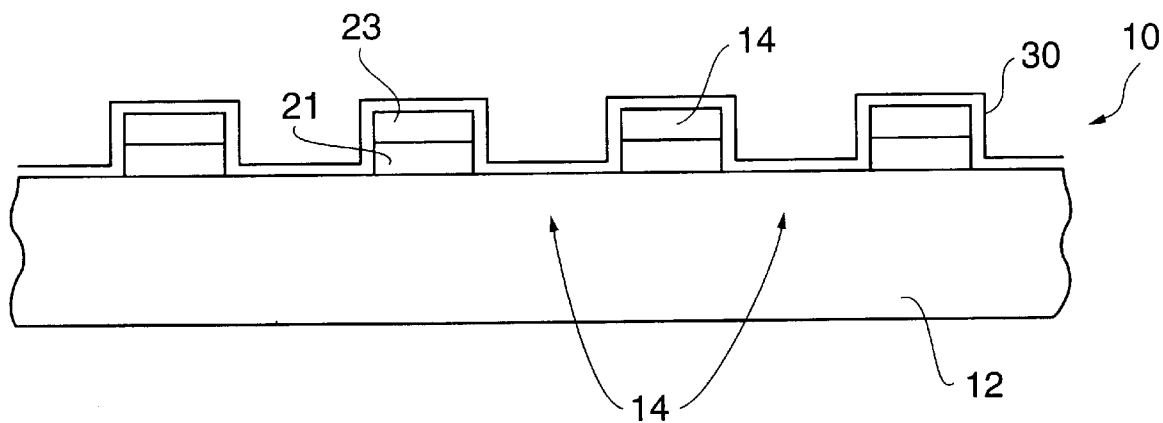
FIG. 2 is a side view of another semiconductor device at an intermediate stage of fabrication and illustrating the process of the invention.

Referring now to FIG. 2, the novel method of the invention first involves deposition of a nucleation layer in situ over a semiconductor device intermediate structure which includes gate stacks 14 previously fabricated on substrate 12 of a semiconductor device 10 in a known manner. The nucleation layer 30 typically comprises a thin layer of silicon nitride ($Si_3N_4$).

Deposition of the $Si_3N_4$ nucleation layer typically occurs in an industrial scale device which has been adapted for such use, for example, a batch furnace. However, other apparatus which can provide the silicon nitride nucleation layer (and subsequent precursor layer) having the characteristics hereinafter set forth are also within the scope of the invention.

The process of depositing the nucleation layer 30 is a low temperature and high pressure process. The operating temperature of the batch furnace is typically in the range of about 450 to about 800° C., more preferably about 500 to about 700° C. More desirably, the deposition of nucleation layer 30 is conducted at a temperature of about 550 to about 650° C. Operating pressure is typically greater than about 0.5 Torr, and desirably within the range of about 0.5 to about 5 Torr, and even more preferably within the range of about 1 to about 3 Torr.

Formation of the silicon nitride nucleation layer takes place through reaction of dichlorosilane (DCS) with at least one nitrogen-containing compound. Preferably the nitrogen-containing compound is gaseous ammonia ($NH_3$), but it is also within the scope of the invention to utilize nitrous oxide, nitrogen oxide, or nitrogen gas, either alone or in combination with ammonia ($NH_3$). The flow rate for each of the DCS and the nitrogen containing component(s) is within the range of about 50 to about 500 SCCM/minute, and a rate within the range of about 100 SCCM/minute to about 400 SCCM/minute total is more preferred. In particular, when $NH_3$ is used as the nitrogen-containing component, then the ratio of the flow rate of DCS to the flow rate of $NH_3$ is within the range of about 1/3 to about 1/12, and more desirably within the range of about 1/5 to about 1/10.

The silicon nitride nucleation layer 30 should be relatively thin. It is preferable that this layer not exceed about 50 Angstroms in thickness. More desirably, the nucleation layer should be within the range of about 25–50 Angstroms in thickness.

In a preferred embodiment of the invention, the nucleation layer will not contain any carbon incorporated or added into the silicon nitride.

The low temperature, high pressure process of the invention allows the silicon nitride layer to nucleate uniformly over all available surface types and topologies on the wafer. In this way, conformality issues from array to periphery are significantly reduced or eliminated. Deposition of the nucleation layer according to the method herein described also presents a more uniform nitride surface to deposit the primary layer on. The primary layer together with the nucleation layer will ultimately serve to protect the gate stacks during the subsequent SAC etching.

Figure 3:
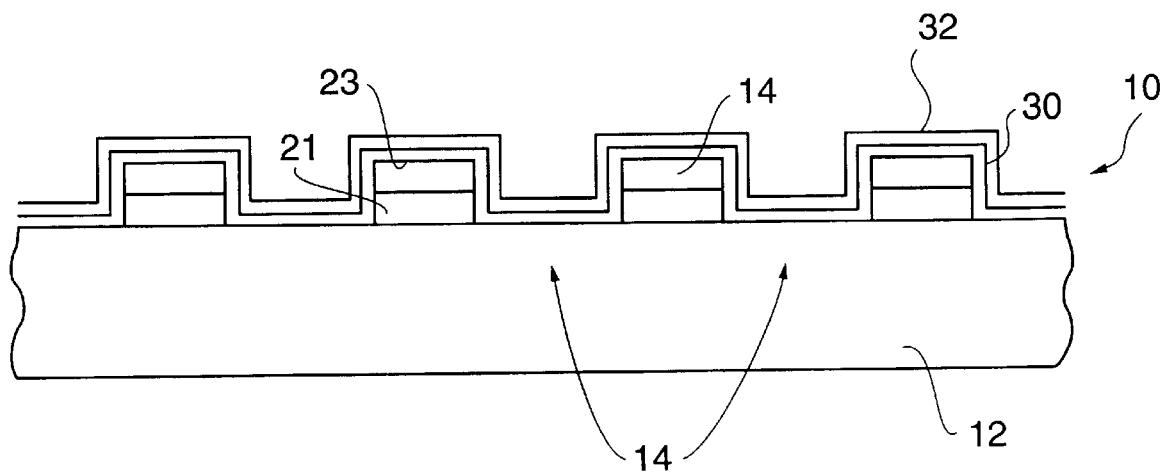
FIGS. 3, 4, 5 and 6 are side views of the semiconductor device shown in FIG. 2 at progressive stages of fabrication.

Referring now to FIG. 3, formation of the spacer film is completed through deposition of the primary layer 32. The primary layer 32 is deposited atop the nucleation layer 30. The primary layer 32 will typically comprise more silicon nitride which is deposited using gaseous bistertbutylaminosilane (BTBAS) as a precursor, or the source of the silicon component of the silicon nitride. This silicon nitride layer is also deposited using at least one nitrogen-containing compound, preferably gaseous ammonia, in addition to the BTBAS as described below.

The primary layer 32 may be formed under the following operating conditions. The operating temperature of the batch furnace will be within the range of about 450 to about 800° C., more preferably about 500 to about 700° C. More desirably, primary layer deposition will be performed at a temperature of about 550 to about 650° C. The flow rate for the BTBAS will be within the range of about 25 to about 500 SCCM/minute, more preferably about 100 to about 400 SCCM/minute. The flow rate for the nitrogen-containing component(s), which reacts with the BTBAS to form the silicon nitride, will be within the range of about 25 to about 1000 SCCM/minute, more preferably about 100 to about 750 SCCM/minute.

Operating pressure for primary layer deposition will be within the range of about 50 to about 2000 milliTorr, and more desirably will be within the range of about 100 to about 1500 milliTorr.

It is desirable to include carbon in the primary layer as well. The carbon is typically included as bound silicon carbide (SiC), and is derived from the BTBAS. The total carbon content which may be present in the primary layer will be within the range of from about 5% to about 25% by weight thereof, which can vary depending upon the particular needs of the skilled artisan. For example, by increasing the operating temperature during the primary layer deposition, it is possible to reduce the amount of silicon carbide incorporated. Conversely, lowering the temperature usually results in an increase in silicon carbide incorporation. In a preferred embodiment, the carbon content of the primary layer should be at least about 10% by weight thereof, and more desirably at least about 20% by weight thereof.

Incorporation of carbon as bound silicon carbide (SiC) in the primary layer often results in the spacer film having excellent resistivity to certain types of wet and dry etch chemistries. In particular, the spacer film of the invention is highly resistant to the freon compounds (fluorinated hydrocarbons) used in dry SAC etching. In addition, the spacer film of the invention demonstrates enhanced resistivity to certain types of fluorine-based wet etchants, particularly HF and HF/TMAH. It is often possible to obtain at least about a five-fold reduction in the wet etchant rate of the spacer film, and more preferably at least about a ten-fold reduction, through the incorporation of carbon in the primary layer. In addition, the spacer film herein provided also exhibits selectiveness to certain other types of wet etchants, e.g. phosphoric acid, which may be useful in certain applications. Thus, the spacer film exhibits an increased etchant rate in these acids, while at the same time exhibiting a decreased rate in other types of wet etchants, e.g. HF.

The silicon nitride-based spacer film with incorporated carbon often results in less electrical leakage and less breakdown potential per unit area of film applied, as compared to a standard silicon nitride spacer film with no carbon.

The primary layer 32 will typically be deposited to a thickness within the range of about 200 to about 600

Angstroms, more preferably about 250 to about 500 Angstroms. The thickness may vary, depending upon what spacer thickness is needed or desired for a particular application. In particular, the primary layer 32 should be within the range of about four times (4x) to about twelve times (12x) the thickness of the nucleation layer.

It has been found that chemical utilization of the primary layer 32 can be increased by about 20% more, or even greater, than in conventional techniques of forming a spacer film, when a thin seed layer of silicon nitride is used as nucleation layer as heretofore described. In certain embodiments, it may be possible to attain utilization of at least about 30% more. As an example, if the primary layer is about 500 Angstrom, and the seed or nucleation layer is comprised of silicon nitride, then deposition may take about 10 minutes. If the underlying surface is comprised of a material other than silicon nitride, such as an oxide material, e.g. silicon oxide, then deposition of the same 500 Angstrom primary layer thereover can typically take about 12 minutes. The result of a 20% decrease in deposition time for the same thickness primary layer when a silicon nitride nucleation layer is first deposited means that the BTBAS used in forming the primary layer has been more efficiently utilized as a chemical component. Also, since less time for deposition is typically involved, more uniform thickness depositions are attained as well since there is less time for variations to develop.

Figure 4:
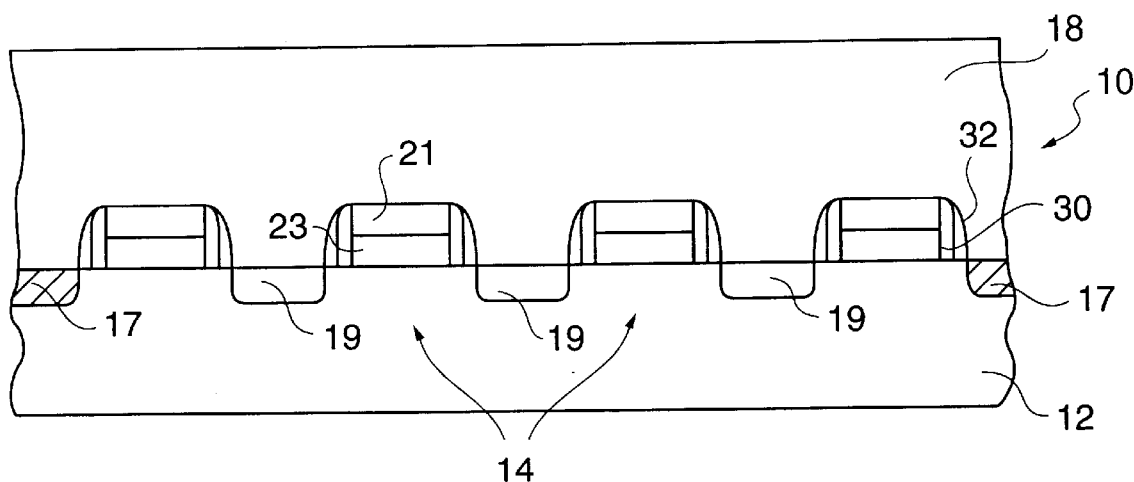

Referring now to FIG. 4, following application of the primary layer 32 the formation of the spacer film layers 30, 32 is completed. The spacer film layers may then be removed from the planar surfaces of the substrate 12 through sputtering or other processes known in the art, and doped active regions 19 may be created in the substrate. Also shown in FIG. 4 are field oxide isolation regions 17 fabricated in/on the substrate 12 to isolate the wafer region illustrated in FIG. 4, as well known in the art. A layer of Boro-Phospho-Silicate Glass (BPSG) 18 has also been applied to the wafer using methods known in the art. BPSG is a silicon dioxide layer which contains boron and phosphorus atoms. The BPSG layer 18 provides a relatively thick insulation layer between the gate stacks 14 on the wafer surface and may be used as a platform for fabrication of metal runners or other structures such as capacitors which will subsequently be created.

Figure 5:
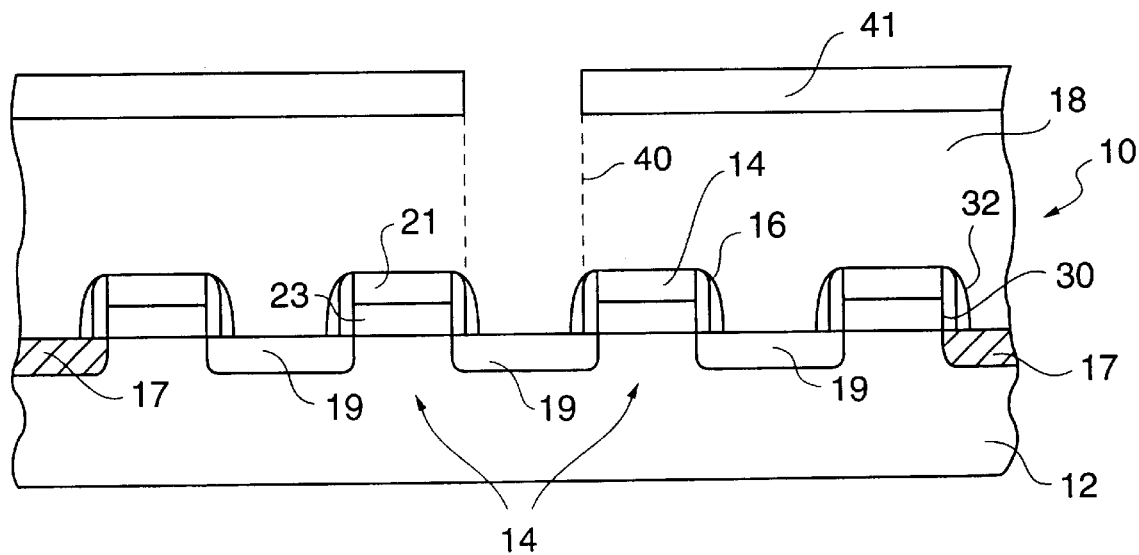

Referring now to FIG. 5, it is the BPSG which is then pattern masked to provide a photoresist mask layer 41, and then etched using a SAC process 40 to provide openings for a contact plug, which is usually comprised of polysilicon or other suitable conductive material. The etching material penetrates the BPSG between the gate stacks to provide access to the wafer substrate.

It is at this stage of wafer processing that the spacer film 30, 32 comes into play. Spacer film 30, 32 protects the gate stacks from the etchant chemistry and prevents crevices from forming in the spacer film and resists seepage of the etchant chemistry between the gate stack and spacer film deposited thereon.

Figure 6:
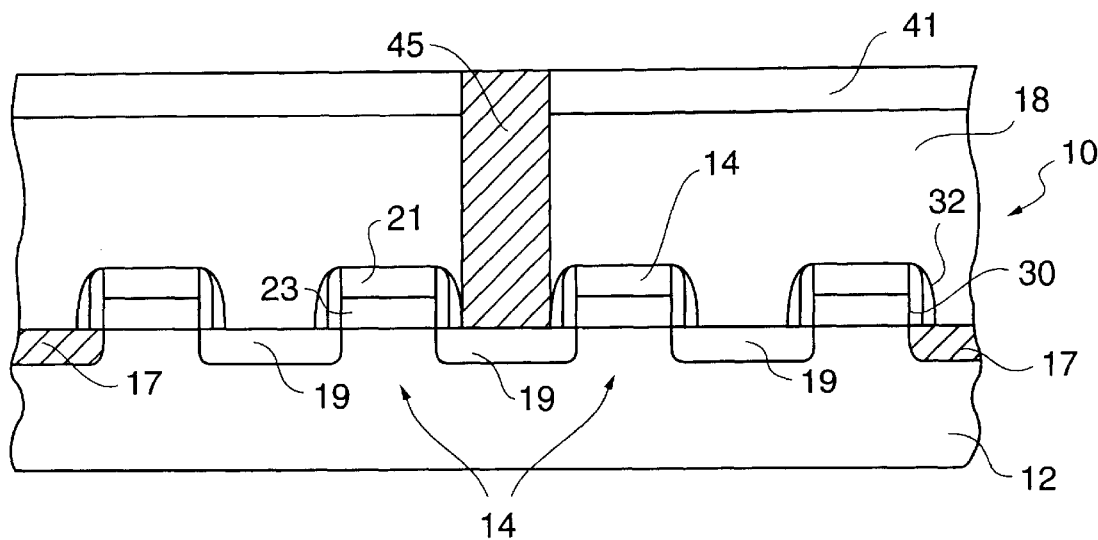

Referring now to FIG. 6, a conductivity plug 45 is typically deposited in the space etched by the SAC process. The plug presents a good contact with the substrate. In addition, the spacer film deposited according to the method of the invention has not been eroded during the SAC process. The spacer film 30, 32 properly separates the gate stack(s) 14 from the plug 45.

The intermediate structure illustrated in FIG. 6 may then have the masking layer 41 and an upper portion of plug 45 removed by, e.g. CMP to form a flat top surface which can be further utilized to form, e.g. a memory structure, such as a DRAM, as well known in the art.

Figure 7:
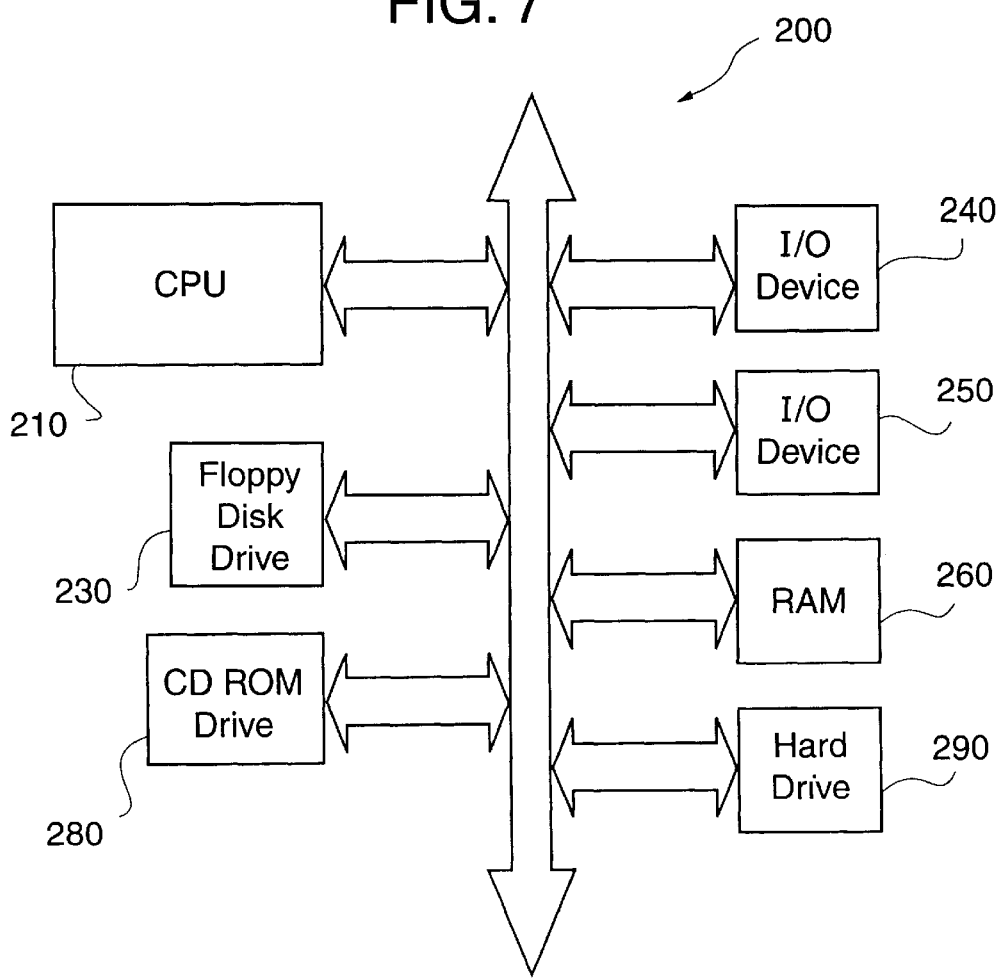
FIG. 7 is a block diagram of a typical processor based system which includes integrated circuits that utilize the spacer film according to the present invention.

A typical processor based system which includes integrated circuits that utilize the spacer film according to the present invention is illustrated generally at 200 in FIG. 7. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 210, for example, a microprocessor, that communicates with one or more input/output (I/O) devices 240, 250 over a bus 270. The computer system 200 also includes a floppy disk drive 230, a random access memory (RAM) 260, a read only memory (ROM) 280, hard drive 290 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include gate stacks having spacer films formed in accordance with the invention. It may also be desirable to integrate the processor 210 and memory 260 on a single IC chip and processor 210 may also employ gate stacks having spacer films formed in accordance with the invention.

The above description are only illustrative of exemplary embodiments which achieve the objects, features and advantages of the present invention. It is not intended that the present invention be limited to these exemplary embodiments. Accordingly, the invention is not to be considered as limited by the foregoing description, but is only limited by the scope of the appended claims.

What is claimed as new and desired to be protected by Letters Patent of the United States is:

1. A spacer film for a gate stack array in a semiconductor device, comprising:

a nucleation layer of silicon nitride;

a primary layer of silicon nitride atop said nucleation layer, said primary layer further comprising carbon.

2. The spacer film of claim 1, wherein said nucleation layer does not contain any added carbon.

3. The spacer film of claim 1, wherein said spacer film exhibits an etch rate in a fluorine-based etchant which is about four times to about twelve times less than a spacer film not having a nucleation layer.

4. The spacer film of claim 1, wherein said nucleation layer is not greater than about 50 Angstroms in thickness.

5. The spacer film of claim 4, wherein said nucleation layer is within the range of about 25 to about 50 Angstroms in thickness.

6. The spacer film of claim 1, wherein said primary layer is about 200 to about 600 Angstroms thick.

7. The spacer film of claim 6, wherein said primary layer is about 250 to about 500 Angstroms thick.

8. The spacer film of claim 7, wherein said primary layer comprises carbon in an amount of about 5 to about 25% by weight thereof.

9. The spacer film of claim 8, wherein said primary layer comprises at least about 10% carbon by weight thereof.

10. The spacer film of claim 9, wherein said primary layer comprises at least about 20% carbon by weight thereof.

11. A semiconductor device comprising:
   a gate stack over a substrate; and
   said gate stack having substantially vertical sides relative to said substrate;
   a nucleation layer of silicon nitride in contact with at least the sides of said gate stack; and
   a primary layer comprising silicon nitride and carbon in contact with said nucleation layer.

12. The device of claim 11, wherein said primary layer comprises carbon in the form of silicon carbide.

13. The device of claim 11, wherein said nucleation layer is comprised of silicon nitride.

14. The device of claim 13, wherein said nucleation layer does not contain any added carbon.

15. The device of claim 11, wherein said primary layer is within the range of about 200 to about 600 Angstroms in thickness.

16. The device of claim 15, wherein said primary layer is within the range of about 250 to about 500 Angstroms in thickness.

17. The device of claim 11, wherein said carbon comprises about 5 to about 25% by weight of said primary layer.

18. The device of claim 17, wherein said carbon comprises at least about 10% by weight of said primary layer.

19. The device of claim 17, wherein said carbon comprises at least about 20% by weight of said primary layer.

20. The device of claim 11, wherein said nucleation layer is not greater than about 50 Angstroms in thickness.

21. The device of claim 20, wherein said nucleation layer is within the range of about 25 to about 50 Angstroms in thickness.

22. The device of claim 21, wherein said primary layer is formed by the reaction of BTBAS and at least one nitrogen-containing compound.

23. The device of claim 22, wherein said nitrogen-containing compound is gaseous ammonia.

24. A memory device comprising:
   a substrate;
   at least one pair of gate stacks on said substrate;
   a spacer film on said gate stacks, said spacer film comprising a nucleation layer and a primary layer, said primary layer comprising silicon nitride and carbon and being in contact with said nucleation layer;
   an insulation layer over said gate stacks and said spacer film; and
   a conductive plug in contact with said substrate, said conductive plug provided in said insulation layer between said gate stacks, wherein said conductive plug is separated from said gate stacks by said spacer film.

25. The memory device of claim 24, wherein said nucleation layer is not greater than about 50 Angstroms in thickness.

26. The memory device of claim 25, wherein said nucleation layer is within the range of about 25 to about 50 Angstroms in thickness.

27. The memory device of claim 24, wherein said primary layer comprises said carbon in the form of silicon carbide.

28. The memory device of claim 27, wherein said nucleation layer consists essentially of silicon nitride.

29. A processor based system comprising:
   a processor; and
   an integrated circuit device coupled to said processor, at least one of said processor and integrated circuit device comprising:
   a substrate;
   at least one pair of gate stacks on said substrate;
   a spacer film on said gate stacks, said spacer film comprising a nucleation layer and a primary layer, said primary layer comprising silicon nitride and carbon and being formed over said nucleation layer;
   an insulation layer over said gate stacks and said spacer film; and
   a conductive plug in contact with said substrate, said conductive plug provided in said insulation layer between said gate stacks, wherein said conductive plug is separated from said gate stacks by said spacer film.

30. The system of claim 29, wherein said nucleation layer is not greater than about 50 Angstroms in thickness.

31. The system of claim 30, wherein said nucleation layer is within the range of about 25 to about 50 Angstroms in thickness.

32. The system of claim 29, wherein said primary layer comprises carbon in the form of silicon carbide.

33. The system of claim 32, wherein said nucleation layer consists essentially of silicon nitride.

34. The system of claim 33, wherein said integrated circuit device is a memory device.

35. The system of claim 34, wherein said processor and said memory device are on a common chip.

* * * * *

UNITED STATES PATENT AND TRADEMARK OFFICE
CERTIFICATE OF CORRECTION

PATENT NO.    : 6,515,350 B1
DATED         : February 4, 2003
INVENTOR(S)   : John Moore It is certified that error appears in the above-identified patent and that said Letters Patent is hereby corrected as shown below:

<u>Column 7,</u>
Line 30, "17" should read -- 18 --

Signed and Sealed this

Nineteenth Day of August, 2003

JAMES E. ROGAN
*Director of the United States Patent and Trademark Office*